US006998880B2

(12) United States Patent
Müller et al.

(10) Patent No.: US 6,998,880 B2
(45) Date of Patent: Feb. 14, 2006

(54) DRIVER CIRCUIT

(75) Inventors: Christian Müller, Woerth (DE); Henrik Icking, München (DE); Martin Glas, München (DE)

(73) Assignee: Infineon Technologies AG, (DE)

( * ) Notice: Subject to any disclaimer, the term of this patent is extended or adjusted under 35 U.S.C. 154(b) by 0 days.

(21) Appl. No.: 10/675,244

(22) Filed: Sep. 29, 2003

(65) Prior Publication Data

US 2004/0124890 A1    Jul. 1, 2004

(30) Foreign Application Priority Data

Sep. 30, 2002  (DE)  ................................. 102 45 654

(51) Int. Cl.
*H03B 1/00*  (2006.01)
(52) U.S. Cl. ........................ 327/108; 327/112; 326/82; 326/85
(58) Field of Classification Search ................ 327/108, 327/112, 111, 109; 326/82, 83, 85, 86, 87, 326/91
See application file for complete search history.

(56) References Cited

U.S. PATENT DOCUMENTS

| 4,539,489 | A | * | 9/1985 | Vaughn | ....................... 327/206 |
| 6,018,257 | A | * | 1/2000 | Hung et al. | .................. 327/112 |
| 6,081,412 | A |   | 6/2000 | Duncan et al. | ................ 361/86 |
| 6,130,556 | A |   | 10/2000 | Schmitt et al. | ................ 326/81 |
| 6,353,346 | B1 | * | 3/2002 | Chan | ........................... 327/112 |
| 6,628,149 | B1 | * | 9/2003 | Ajit | ............................. 327/108 |
| 2003/0122606 | A1 | * | 7/2003 | Ajit et al. | .................... 327/309 |
| 2004/0017229 | A1 | * | 1/2004 | Ajit | ............................. 327/112 |

FOREIGN PATENT DOCUMENTS

| EP | 1 081 860 A1 | 3/2001 |
| WO | WO 02/056473 A2 | 7/2002 |

* cited by examiner

Primary Examiner—Tuan T. Lam
Assistant Examiner—Hiep Nguyen
(74) Attorney, Agent, or Firm—Peter F. Corless; Christine C. O'Day; Edwards Angell Palmer & Dodge LLP

(57) ABSTRACT

The invention relates to a driver circuit with
  a circuit node (10),
  at least two first transistors (P1, P2), the load sections of which are switched in series and connect the circuit node (10) with a first voltage ($U_{10}$),
  at least two second transistors (N1, N2), the load sections of which are switched in series and connect the circuit node (10) with a reference potential, and
  a control circuit (P3–P6, N3, D1–D4, R1, 16), which is formed in order to regulate at least a first control voltage ($U_{p2}$) on at least one transistor (P2) of the at least two first transistors (P1, P2) and at least a second control voltage ($U_{N2}$) on at least one transistor (N2) of the at least two second transistors (N1, N2) dependent on a voltage at the circuit node (10).

8 Claims, 2 Drawing Sheets

DRIVER CIRCUIT

The invention relates to a driver circuit, in particular an IO driver circuit.

In the case of complex integrated electronic circuits frequently several different circuit modules share a common bus, for example a data or control bus. In order to avoid access conflict on the bus, it must be possible to disconnect the circuit modules from the bus. This is usually ensured by the fact that bus-connected driver circuits of the circuit modules can be changed into several different states. The different states in particular comprise an active state, in which a circuit module is electrically coupled with the bus, in order to be able to drive data to the bus, as well as an inactive state, in which a driver circuit is connected in such a manner that the module is uncoupled from the bus, that is to say it cannot drive data to the latter. For example the driver circuit is connected at high impedance for this purpose.

Over- and/or under-voltages can occur on buses, for example when a maximum or a minimum permissible voltage level on a bus is exceeded or not reached. As a result damage or malfunctioning of the driver circuits can occur.

Circuit modules, which are operated with different supply voltages, can also be connected to a common bus. An example for this case is the operation of circuit modules with a supply voltage of 3.3 V on a common bus together with circuit modules which are operated with a supply voltage of 5 V. Here the driver circuits of the low voltage circuit modules must not be destroyed or impaired in their function by voltage levels up to 5 V or even higher if voltage surges occur.

FIG. 2 shows a known driver circuit, which is implemented for a CMOS process. The driver circuit is coupled via a circuit node 10 to a bus (not represented). In the case of an integrated circuit the circuit node 10 can be a pad for example. The circuit node is connected via the load sections of two p-channel-MOSFET's P1 and P2 switched in series with a first voltage $U_{10}$. In addition the circuit node 10 is connected via the load sections of two n-channel-MOSFET's N1 and N2 switched in series with a reference potential of 0 V for example.

Digital data are switched to the circuit node 10 by a circuit module (not represented) via a first and a second port 18 or 20 of the driver circuit. For this purpose the first port 18 is connected via a gate control circuit 12 to the gate of the MOSFET P1. A logic high level corresponding to the first voltage $U_{10}$ can be switched by a distributor logic (not represented) of the circuit module to the circuit node 10 via the first port 18. On the other hand the circuit node 10 via the second port 20, which is connected to the gate of the MOSFET N1 can be connected to the reference potential. Therefore the distributor logic can switch a logic low level via the second port 20 to the circuit node 10.

The driver circuit can be switched by the two transistors P2 and N2 via the ports 18 and 20 to an active or an inactive state. A first and a second port 22 or 24 of the driver circuit are provided for permanently pre-set specified bias voltages. The first port 22 is connected to the gate of the MOSFET P2, the second port 24 to the gate of the MOSFET N2. A voltage $U_{biasp}$ or $U_{biasn}$ is applied to the first and second port 22 or 24, these voltages maintaining their value invariably for the active and inactive state and lead to the problems described below in detail.

In the active state of the driver circuit the two voltages $U_{biasp}$ and $U_{biasn}$ are selected in such a way that the transistors P2 and N2 are operated in saturation. In this way it is ensured that electric currents can be driven via the transistors P2 and N2 according to an interface specification to the circuit node 10 and the bus connected thereto. Furthermore the two transistors N2 and P2 are provided for blocking off capacitance effects of the circuit node 10.

When the driver circuit is in an inactive state, the two transistors P1 and N1 are in a non-conductive state. This is obtained by applying the first voltage $U_{10}$ at the gate of the transistor P1 and the reference potential at the gate of the transistor N1. Thus the paths are switched at high impedance from the circuit node 10 to the potential $U_{10}$, and to the reference potential. The potential on the circuit node 10 now depends on the voltage ratios on the bus, which is connected to the circuit node 10. In particular other driver circuits on the same bus or relatively high impedance bus restraining resistors can determine the voltage ratios.

As already indicated in the case of some interface and bus specifications the pre-specified voltage levels on a bus can be exceeded or not reached, in particular if circuit modules or components are connected with varying supply voltages to a common bus. As a result the voltage levels on the bus can in principle become greater than the maximum permissible voltage levels on the transistors N2 and P2. In order to prevent destruction or malfunctioning of the transistors P2 and N2, it is therefore necessary in the inactive state to apply bias voltages via the ports 22 or 24 at the gates of the two transistors P2 and N2, which change the transistors P2 and N2 to a state in which the maximum permissible voltage cannot be exceeded between the circuit node 10 and the respective gate of the transistors P2 and N2.

In this case it should be ensured that the two transistors P2 and N2 can withstand all permissible voltage levels on the bus, voltage levels which act directly on the circuit node 10. If however the range of voltage levels occurring on the circuit node 10 becomes too great, the bias voltages applied to the ports 22 and 24 can no longer meet the demands on the two transistors P2 and N2 in the active state of the driver circuit. For example major or minor bias voltages can be selected in such a manner that in the active state only minor currents can flow through the load sections of the two transistors P2 and N2, so that the driver circuit can in total only drive a minor current to the circuit node 10 and is therefore only suitable for buses with a minimum capacitance load as well as for applications with low frequencies and possibly the specification of the interface can no longer be maintained.

In order to circumvent this problem, the two transistors P2 and N2 can be designed to have a wide area. As a result they are also able with high bias voltages to drive sufficiently major currents to the circuit node 10. However a driver circuit of this kind if integrated on a semiconductor chip requires a very large surface area, as a result of which the integrated circuit becomes expensive.

The following numerical example clarifies the problem: in a model CMOS technology transistors are available, which can be operated with maximum voltages of 3.6 V. Should driver circuits be implemented, which can be operated both in a 3.3 V as well as in a 5.0 V (interface) environment, approximately 3.3 V should be selected as the first voltage $U_{10}$ due to the voltage limitation of the transistors. If now components or circuit modules, which are operated with a supply voltage of 5.0 V, are also connected to a bus, that is connected to the driver circuits, voltage levels between approximately −0.9 V up to approximately 6.0 V can arise on the circuit node 10 due to over- and under-swinging of the driver circuits in the inactive state.

In order to prevent the maximum voltage between gate and drain (which is connected to the circuit node 10) of the transistors P2 and N2 being exceeded, a value of approximately 2.4 V (6.0 V–3.6 V) should be selected for the two bias voltages $U_{biasn}$ and $U_{biasp}$. As a result the voltage levels arising throughout the range on the circuit node 10 cannot exceed the maximum permissible transistor voltages. However the transistor P2 is not in saturation with a gate voltage of approximately 2.4 V, as a result of which for a sufficient current a large channel and therefore a substantial surface area for the transistor P2 are necessary.

The object of the present invention is to propose a driver circuit, which is to be implemented in particular on an integrated circuit in a cost-favourable way for a wide voltage level range on a circuit node.

This object is achieved by a driver circuit with the features according to claim 1. Preferential embodiments of the invention result from the dependent claims.

An essential concept of the invention consists in regulating a control voltage of at least one transistor of a driver circuit, the load section of which is connected to a circuit node of the driver circuit, dynamically dependent on a voltage at the circuit node. This prevents a maximum permissible voltage being exceeded on at least one transistor, for example through high voltage on the circuit node due to over- or under-swinging on a bus connected to the driver circuit, which could destroy the at least one transistor or impair its function.

In a concrete embodiment the invention relates to a driver circuit with a circuit node, at least two first transistors, the load sections of which are switched in series and which connect the circuit node with a first voltage, at least two second transistors, the load sections of which are switched in series and which connect the circuit node with a reference potential, and a control circuit, which is formed in order to regulate at least a first control voltage on at least one transistor of the at least two first transistors and at least a second control voltage on at least one transistor of the at least two second transistors dependent on a voltage at the circuit node.

A driver circuit of this kind is advantageously suitable for circuit modules which are operated with several circuit modules on a common bus. It can however also be used just as advantageously in any electronic circuit, in which over-voltages or under-voltages can occur on a circuit node.

A further advantage of the present invention is that the driver circuit in the active state consumes no static power, which in the case of conventional driver circuits is usually the norm.

The control circuit can also be formed in order to change the driver circuit dependent on an enabling signal to an active or an inactive state. As a result the driver circuit can be operated on buses where several circuit modules are electrically coupled with driver circuits at the same time. The enabling signal may for example be generated centrally by a bus-arbiter circuit, which monitors access to a common bus. Equally the enabling signal may also be generated de-centrally by a circuit module, which the driver circuit uses or by another circuit module.

The control circuit is also preferably formed in order to regulate the control voltages in the active state, in such a manner that the transistors controlled by the control voltages are approximately in saturation. As a result the transistors controlled by the control voltages are optimally selected and can drive major currents in the active state. If the driver circuit is integrated on a semiconductor chip, transistors can therefore be used with a smaller surface area than in the case of a driver circuit, in which the transistors in the active state can be operated as initially described not in saturation.

The control circuit is also formed, in a preferential embodiment, in order to reduce the control voltages in the inactive state by a pre-set voltage, when at least one threshold value is exceeded as a result of the voltage on the circuit node. In other words the voltage on the circuit node is monitored for exceeding at least the threshold value by the control circuit. Only if the at least one threshold value is exceeded does the control of the control circuit, which regulates the control voltages, become active and reduce the control voltages in particular to prevent damage or malfunctioning of the transistors.

In a concrete embodiment, in particular for implementing the at least one threshold value, the control circuit may comprise a first electrical path from the circuit node to the reference potential, which electrical path has at least one diode in order to pre-set at least one threshold value.

The first path in a preferential embodiment also has a switch, which is controlled by the enabling signal. As a result of the switch, preferably a transistor, the first path can, for example, be switched off via the enabling signal in the active state of the driver circuit.

Further regulation of the at least one threshold value may be achieved by a resistor in the first path. The resistor may also serve to limit the current through the first path.

The control circuit preferably comprises a second electrical path. This comprises the load section of a transistor, which on one port is connected with a second voltage and on the other port with a diode. The transistor can be controlled by the enabling signal. The second path serves in particular to regulate pre-set control voltages in the inactive state, especially as long as the voltage on the circuit node is below the at least one threshold value. Above all the second path prevents damage to the transistors or malfunctioning of the same, if the minimum permissible voltage on the circuit node is not reached.

The driver circuit according to the invention is preferably implemented in CMOS technology. The transistors are then MOSFET's.

In particular the at least two first transistors are p-channel MOSFET's and the at least two second transistors are n-channel MOSFET's.

Finally a gate control may be proposed, which serves to control the gate voltage of at least one transistor of the at least two first transistors. The gate control with a voltage on the circuit node, which is greater than the first voltage, increases the potential on the gate of the at least one transistor approximately to the voltages on the circuit node. As a result the at least one transistor is prevented from switching on by itself due to the high voltage on the circuit node.

With such a high voltage on the circuit node in order to prevent current flowing through diodes between wells of the at least two first transistors and the substrate, a well control may further be provided for controlling the well voltages of the at least two first transistors. The well control, similar to the gate control, increases the voltage on the wells in such a manner that the wells/substrate diodes cannot conduct if there is a high voltage on the circuit node.

Further advantages, features and possible applications of the present invention result from the following description in conjunction with the embodiments represented in the drawing.

The invention is described in detail below on the basis of the embodiments represented in the drawing, wherein.

In the following partly the same, functionally similar and/or similarly acting components and/or signals are designated with the same reference symbols. With regard to the description of FIG. 2 reference is made to the introduction to the description.

Figure 1:
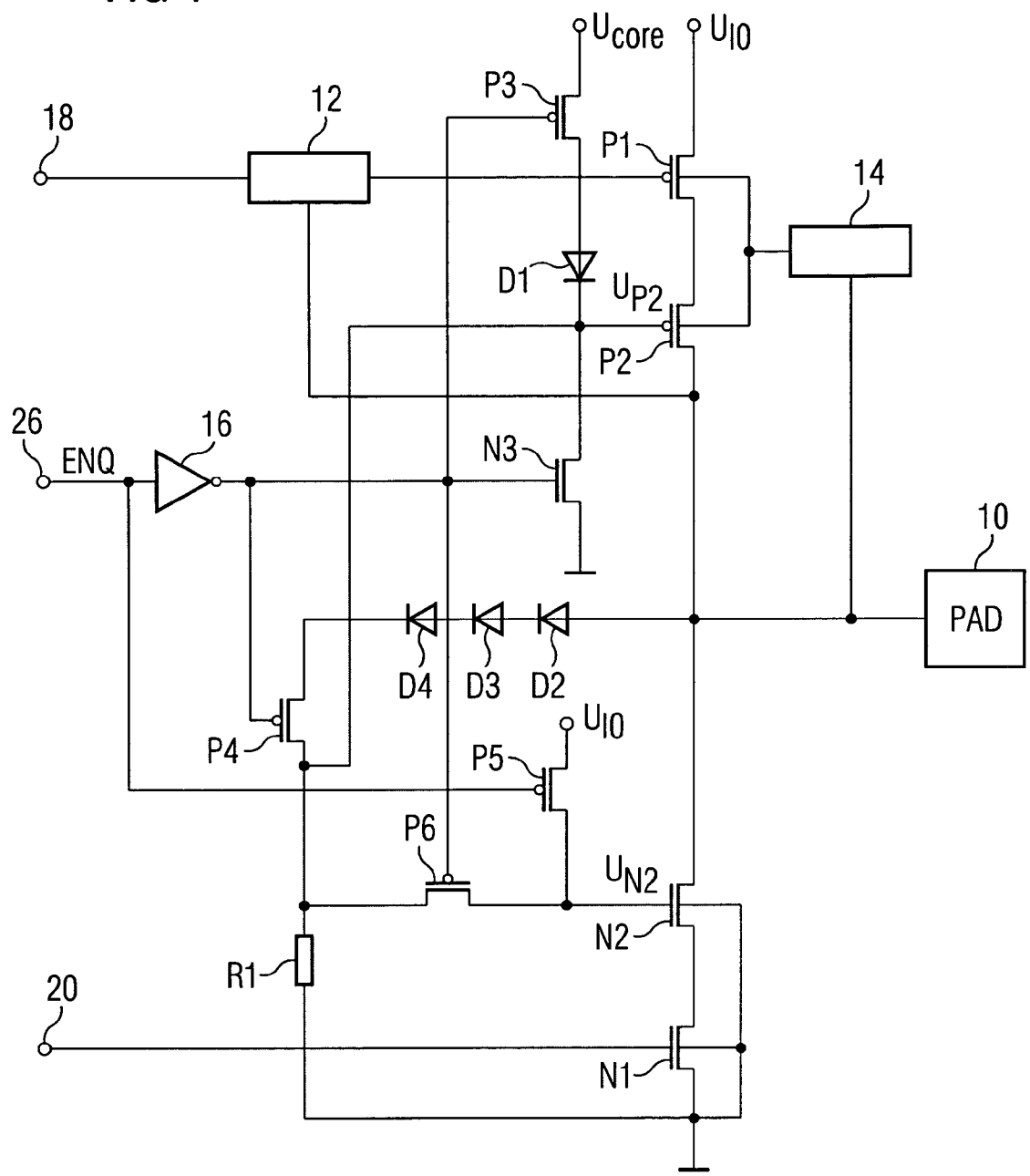
FIG. 1 shows an embodiment of the driver circuit according to the invention.
Figure 2:
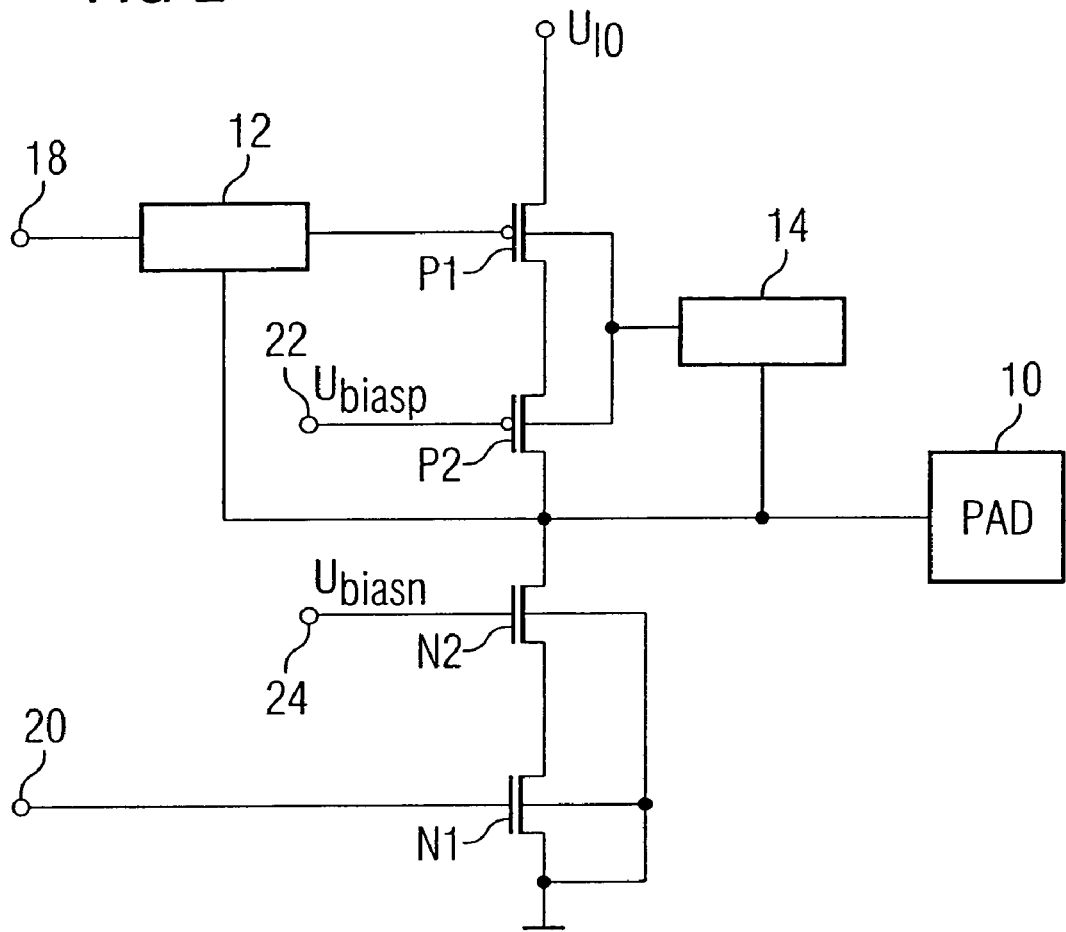
FIG. 2 shows an embodiment of a known driver circuit.

The driver circuit shown in FIG. 1, like the circuit represented in FIG. 2, has a circuit node 10, MOSFET's P1, P2, N1 and N2, a first and second port 18 or 20 for a distributor logic, a gate control circuit 12 and an n-well control circuit 14. The MOSFET's P1, P2, N1 and N2 have the same function as the driver circuit shown in FIG. 2 and are of the same type.

An enabling signal ENQ can be sent via an enabling port 26 to the driver circuit illustrated, which switches the driver circuit into an active or an inactive state. Since the enabling port 26 is low active, a logic high signal on the enabling port 26 switches the driver circuit into the inactive state, while a logic low signal on the enabling port 26 switches the driver circuit into the active state.

A control circuit of the driver circuit illustrated is essentially formed by an inverter 16, an n-channel-MOSFET N3, p-channel-MOSFET's P3–P6, diodes D1–D4 and a resistor R1. The control circuit in particular serves to produce control voltages $U_{P2}$ and $U_{N2}$, which are fed to the MOSFET's P2 or N2. The MOSFET P5 is, like the MOSFET P1, connected with a voltage $U_{IO}$, while the two MOSFET's N1 and N3 are connected with a reference potential.

In order to change the driver circuit illustrated into an active state, the enabling signal ENQ, which has a logic low level, is fed from an internal logic of a circuit module, that is connected to the driver circuit via the enabling port 26. The fed enabling signal ENQ is inverted by the inverter 16 and supplied to the transistors N3, P3, P4 and P6. Furthermore the enabling signal ENQ is supplied directly to the transistor P5. Due to the logic low level of the enabling signal ENQ the transistors P5 and N3 are changed to a conductive state, while the transistors P3, P4 and P6 are blocked due to the inverted enabling signal ENQ.

The conductive MOSFET N3 ensures that the control voltage $U_{P2}$ lies on the reference potential, so that the p-channel-MOSFET P2 is changed to a conductive state. Likewise the conductive MOSFET P5 ensures that the control voltage $U_{N2}$ lies approximately on the potential of the first voltage $U_{IO}$, so that the n-channel-MOSFET N2 is likewise conductive. In particular the two transistors P2 and N2 are in saturation, so that maximum current can flow via their load sections. The potential or the logic level on the reference node 10 can now be determined via the two MOSFET's P1 and N1.

The driver circuit is changed into the inactive state, if a logic high level lies on the enabling port 26 as enabling signal ENQ. This ensures that the two transistors N3 and P5 are blocked. Due to the inverted enabling signal ENQ the transistors P3, P4 and P6 are changed into the conductive state. The gates or control ports of the two transistors P2 and N2 are then connected with one another via the now conductive transistor P6, to be more exact its load section.

If now no over-voltage arises on the circuit node 10, that is to say voltage on the circuit node 10 does not exceed a pre-set threshold value, a bias voltage is generated via the MOSFET P3, the diode D1 and the resistor R1, from which bias voltage the control voltages $U_{P2}$ and $U_{N2}$ are derived for the two transistors P2 or N2. The bias voltage is derived from a voltage $U_{core}$, which lies on a port of the load section of the MOSFET P3. In a typical embodiment the bias voltage lies at approximately 1 V. As a result negative voltages on the circuit node 10 of up to approximately −1 V cannot generate inadmissibly high voltages on the two transistors P2 and N2.

As soon as the voltage on the circuit node 10 exceeds the pre-set threshold value mentioned above, the path to the reference potential formed by the diodes D2 to D4, the load section of the MOSFET P4 and the resistor R1 becomes conductive. As a result a voltage is applied on the circuit node of the load sections of the two transistors P4 and P6, which lies about three diode threshold voltages below the voltage on the circuit node 10 and increases in proportion to the voltage on the circuit node 10. As a result of the diode D1 a current flowing from the circuit node to the voltage $U_{core}$ via the load section of the transistor P3 is blocked.

In particular due to the voltage formed on the circuit node of the two load sections of the transistors P4 and P6, which increases in proportion to the voltage on the circuit node 10, the voltage between gate and circuit node of the two transistors P2 and N2 is now prevented from becoming inadmissibly high, which could lead to the destruction of the two transistors.

An advantage of the control circuit illustrated consists in the easy scalability of the bias voltage. By suitable choice of the resistor R1 and the number of diodes in the diode chain D1–D4 the bias voltage may be adapted to a technology in which the driver circuit illustrated is produced. The pre-voltage of the gates or control ports of the two transistors P2 and P4 at approximately 1 V in the low voltage range prevents short term voltage surges on the two transistors P2 and N2 should the potential on the circuit node 10 increase very rapidly and the readjusting circuit from the diodes D2–D4 and the resistor R1 cannot "cope with" this rapid increase.

In order to prevent the MOSFET P1 from switching on automatically or a current from flowing through the diode which is formed by the n-well and the p-substrate in the case of the two p-channel-MOSFET's P1 and P2, the gate control circuit 12 and the n-well gate circuit 14 are provided. These two gate circuits 12 and 14 ensure that if there is potential on the circuit node 10, which is greater than the voltage $U_{IO}$ the potential of the n-wells of the two transistors P1 and P2 and the potential at the gate of the transistor P1 are increased approximately to the potential on the circuit node 10.

The invention claimed is:

1. A driver circuit comprising:
   a circuit node,
   at least two first transistors, connected in series and connect the circuit node with a predetermined voltage,
   at least two second transistors, connected in series and connect the circuit node with a reference potential,
   a control circuit designed to regulate at least a first control voltage on at least one transistor of the at least two first transistors and at least a second control voltage on at least one transistor of the at least two second transistors dependent on a voltage at the circuit node,
   wherein the control circuit is also designed to increase the control voltages in an inactive state of the driver circuit, when at least one threshold value is exceeded by the voltage on the circuit node,
   wherein the control circuit is also designed to change the driver circuit dependent on an enabling signal into an active or the inactive state, and wherein the control circuit comprises an electrical path from the circuit node to the reference potential, which electrical path has at least one diode to pre-set the at least one threshold value, further comprising a switching means which is controlled by the enabling signal so that it is conductive in the inactive state and connects control inputs of one of the at least two first transistors and one of the at least two second transistors.

2. The driver circuit according to claim 1, characterized in that the control circuit is also designed to regulate the control voltages in the active state in such a manner that the transistors controlled by the control voltages are approximately in saturation.

3. The driver circuit according to claim 1, wherein the electrical path includes a resistor.

4. The driver circuit according to claim 1, wherein said driver circuit is implemented in CMOS technology and the transistors are MOSFET's.

5. The driver circuit according to claim 4, wherein the at least two first transistors are p-channel MOSFET's and the at least two second transistors are n-channel MOSFET's.

6. The driver circuit according to claim 4, wherein a gate control is provided for controlling the gate voltage of at least one transistor of the at least two first transistors.

7. A driver circuit comprising:
a circuit node,
at least two first transistors, connected in series and connect the circuit node with a predetermined voltage,
at least two second transistors, connected in series and connect the circuit node with a reference potential, and
a control circuit designed to regulate at least a first control voltage on at least one transistor of the at least two first transistors and at least a second control voltage on at least one transistor of the at least two second transistors dependent on a voltage at the circuit node,
wherein the control circuit is also designed to change the driver circuit dependent on an enabling signal into an active or inactive state, wherein the control circuit is designed to increase the control voltages in the inactive state when at least one threshold value is exceeded by the voltage on the circuit node, and wherein the control circuit comprises an electrical path, which comprises the load section of a transistor controlled by the enabling signal, said transistor being connected on the one hand with a further voltage and on the other hand with a diode and serves to regulate the control voltages in the inactive state, as long as the voltage on the circuit node is below the at least one threshold value, further comprising a switching means which is controlled by the enabling signal so that it is conductive in the inactive state and connects control inputs of one of the at least two first transistors and one of the at least two second transistors.

8. A driver circuit comprising:
a circuit node,
at least two first transistors, connected in series and connect the circuit node with a predetermined voltage,
at least two second transistors, connected in series and connect the circuit node with a reference potential, and
a control circuit designed to regulate at least a first control voltage on at least one transistor of the at least two first transistors and at least a second control voltage on at least one transistor of the at least two second transistors dependent on a voltage at the circuit node,
wherein the control circuit is also designed to change the driver circuit dependent on an enabling signal into an active or inactive state, and
wherein the driver circuit is configured in such a manner that in the active state it consumes no static power,
further comprising a switching means which is controlled by the enabling signal so that it is conductive in the inactive state and connects control inputs of one of the at least two first transistors and one of the at least two second transistors.

* * * * *